(12) United States Patent
De Best et al.

(10) Patent No.: US 10,401,743 B2
(45) Date of Patent: Sep. 3, 2019

(54) CONTROL SYSTEM, POSITIONING SYSTEM, LITHOGRAPHIC APPARATUS AND DEVICE MANUFACTURING METHOD

(71) Applicant: ASML Netherlands B.V., Veldhoven (NL)

(72) Inventors: Jeroen Johannes Theodorus Hendrikus De Best, Druten (NL); Wilhelmus Henricus Theodorus Maria Aangenent, Eindhoven (NL); Stan Henricus Van Der Meulen, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/735,956

(22) PCT Filed: May 19, 2016

(86) PCT No.: PCT/EP2016/061236
§ 371 (c)(1),
(2) Date: Dec. 12, 2017

(87) PCT Pub. No.: WO2016/202519
PCT Pub. Date: Dec. 22, 2016

(65) Prior Publication Data
US 2018/0164701 A1    Jun. 14, 2018

(30) Foreign Application Priority Data

Jun. 19, 2015 (EP) ..................................... 15172894

(51) Int. Cl.
*G03F 7/20* (2006.01)
*G05B 11/14* (2006.01)

(52) U.S. Cl.
CPC .......... *G03F 7/70725* (2013.01); *G05B 11/14* (2013.01)

(58) Field of Classification Search
CPC ..... G03F 7/20; G03F 7/70725; G03F 7/70533
(Continued)

(56) References Cited

U.S. PATENT DOCUMENTS 5,442,544 A * 8/1995 Jelinek ................. G05B 13/048
700/29
7,170,581 B2   1/2007 Tousain
(Continued)

FOREIGN PATENT DOCUMENTS

CN   102279529   12/2011
JP   S6444501    2/1989
(Continued)

OTHER PUBLICATIONS

International Search Report and Written Opinion dated Sep. 21, 2016 in corresponding International Patent Application No. PCT/EP2016/061236.
(Continued)

*Primary Examiner* — Hung Nguyen
(74) *Attorney, Agent, or Firm* — Pillsbury Winthrop Shaw Pittman LLP

(57) ABSTRACT

A control system configured to control a parameter of a dynamic system, wherein the parameter depends on an output signal. The control system comprises a set-point generator and a feedforward, wherein the set-point generator is arranged to provide a set-point signal to the feedforward. The feedforward is arranged to provide the output signal based on the set-point signal, wherein the feedforward is arranged to perform a non-linear operation on the set-point
(Continued)

signal. The non-linear operation is based on a non-linear functional relationship between the output signal and the parameter.

20 Claims, 3 Drawing Sheets

(58) Field of Classification Search
USPC .............................................. 355/53, 72–76
See application file for complete search history.

(56) References Cited

U.S. PATENT DOCUMENTS

| | | | |
|---|---|---|---|
| 7,209,219 | B2 | 4/2007 | Butler |
| 7,352,149 | B2 | 4/2008 | Butler et al. |
| 7,818,073 | B2 | 10/2010 | Heertjes |
| 8,373,849 | B2 | 2/2013 | Heertjes |
| 8,392,003 | B2 | 3/2013 | Wiener |
| 8,553,205 | B2 | 10/2013 | Roux et al. |
| 2001/0002303 | A1 | 5/2001 | Yuan |
| 2004/0176861 | A1 | 9/2004 | Butler |
| 2006/0087632 | A1 | 4/2006 | Tousain |
| 2007/0250187 | A1 | 10/2007 | Heertjes |
| 2008/0054838 | A1 | 3/2008 | Butler et al. |
| 2009/0046260 | A1* | 2/2009 | Jansen ................ G03F 7/70533 355/30 |
| 2009/0154311 | A1* | 6/2009 | Wiener ............... G03F 7/70725 369/44.32 |
| 2010/0123890 | A1 | 5/2010 | Heertjes |
| 2010/0222898 | A1 | 9/2010 | Yang |
| 2011/0149263 | A1 | 6/2011 | Roux et al. |

FOREIGN PATENT DOCUMENTS

| | | |
|---|---|---|
| JP | 02-56601 | 2/1990 |
| JP | H0888990 | 4/1996 |
| JP | 2003033065 | 1/2003 |
| JP | 2004171164 | 6/2004 |
| JP | 2004342082 | 12/2004 |
| JP | 2007115101 | 5/2007 |
| JP | 2007294958 | 11/2007 |
| JP | 2008299488 | 12/2008 |
| JP | 2009146426 | 7/2009 |
| JP | 2011008360 | 1/2011 |
| JP | 2013047868 | 3/2013 |
| JP | 2013254231 | 12/2013 |
| JP | 2015045937 | 3/2015 |
| JP | 2015069439 | 4/2015 |

OTHER PUBLICATIONS

Baggen, Mark et al.,"Data-based feed-forward control in MIMO motion systems", 2008 American Control Conference (2008).
Bartusiak, R. Donald et al., "Nonlinear feedforward/feedback control structures designed by reference system synthesis", Chemical Engineering Science, vol. 44, No. 9, pp. 1837-1851 (1989).
Japanese Office Action issued in corresponding Japanese Patent Application No. 2017-564502, dated Dec. 25, 2018.

* cited by examiner

CONTROL SYSTEM, POSITIONING SYSTEM, LITHOGRAPHIC APPARATUS AND DEVICE MANUFACTURING METHOD

CROSS REFERENCE TO RELATED APPLICATION

This application is the U.S. national phase entry of PCT patent application no. PCT/EP2016/061236, which was filed on May 19, 2016, which claims the benefit of priority of European patent application no. 15172894.6, which was filed on Jun. 19, 2015, and which is incorporated herein in its entirety by reference.

BACKGROUND

Field of the Invention

The present invention relates to a control system, a positioning system, a lithographic apparatus and a device manufacturing method.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the known lithographic apparatus a substrate support is provided to support a substrate during transfer of a pattern of the patterning device onto the substrate. A control system is provided to accurately control the position of the substrate support. In a known embodiment of this control system a feedforward is provided. The performance of the control system is highly dependent on the accuracy of the feedforward.

Finite impulse response (FIR) filters are used to improve performance of the feedforward. FIR filters use time shifted operations in order to construct a feedforward signal, i.e. the output of the feedforward is based on the set-point signal of the present time sample and one or more previous time samples.

An example of FIR filters applied in a multi-input-multi output (MIMO) position control system can be found in the publication "Data-Based Feed-Forward control in MIMO Motion Systems" by Mark Baggen, Marcel Heertjes and Ramidin Kamidi, 2008 American Control Conference, Seattle, Jun. 11-13 2008, the contents of which are herein incorporated in its entirety by reference. In this publication, it is proposed to optimize the coefficients of a set of FIR filters on the basis of a quadratic objective function related to a performance-relevant time-frame of the servo error signal using a Gauss-Newton method.

In this method the linear feedforward techniques are used to minimize the error in an iterative way, whereby parameters are perturbed and set such that the error is minimal. This method is also referred to as the machine-in-the-loop procedure.

Although the feed-forward device incorporating FIR filters including coefficients optimized by a Gauss-Newton method may substantially improve the performance of the control system, there is a continuous need to improve the performance of the control system.

In particular, when the dynamic system to be controlled, for example a substrate support, comprises a non-linear characteristic, this non-linear characteristic may have a substantial negative effect on the performance of the control system. In a FIR filter, the non-linearity will have to be mapped during optimization to the linear feedforward coefficients of the FIR filters.

To still meet the desired performance level, this may result in the need of substantial larger FIR filters, and as a consequence, a substantial larger number of feedforward coefficients.

This larger number of feedforward coefficients also increases the time required to calibrate the control system, since each of the coefficients has to be optimized. Thereby, a re-optimization may be required whenever a different set-point is applied.

SUMMARY

It is desirable to provide a control system to control a dynamic system, in particular a dynamic system having a non-linear characteristic, which may provide increased performance and/or decreased calibration time.

Furthermore, it is desirable to provide a positioning system and a lithographic apparatus having such control system.

According to an aspect of the invention, there is provided control system configured to control a parameter (F) of a dynamic system, wherein the parameter depends on an output signal ($g(F(k))$), the control system comprising a set-point generator and a feedforward, wherein the set-point generator is arranged to provide a set-point signal ($F(k)$) to the feedforward, wherein the feedforward is arranged to provide the output signal based on the set-point signal, wherein the feedforward is arranged to perform a non-linear operation on the set-point signal, and wherein said non-linear operation is based on a non-linear functional relationship between the output signal and the parameter.

According to an aspect of the invention, there is provided a positioning system arranged to position an object in a desired position, comprising:

a positioning device configured to position the object, and a control system mentioned above, wherein the dynamic system comprises the positioning device.

According to an aspect of the invention, there is provided a lithographic apparatus configured to project a pattern onto a substrate comprising the positioning system as mentioned above.

According to an aspect of the invention, there is provided a device manufacturing method comprising transferring a pattern from a patterning device onto a target portion of a substrate, wherein the method comprises the steps of:

providing a set-point signal representative of a desired value of a parameter of the patterning device or the substrate;

creating an output signal by performing a non-linear operation on the set-point signal, wherein the non-linear operation is based on a non-linear functional relationship between the output signal and the parameter;

controlling the parameter based on the output signal.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
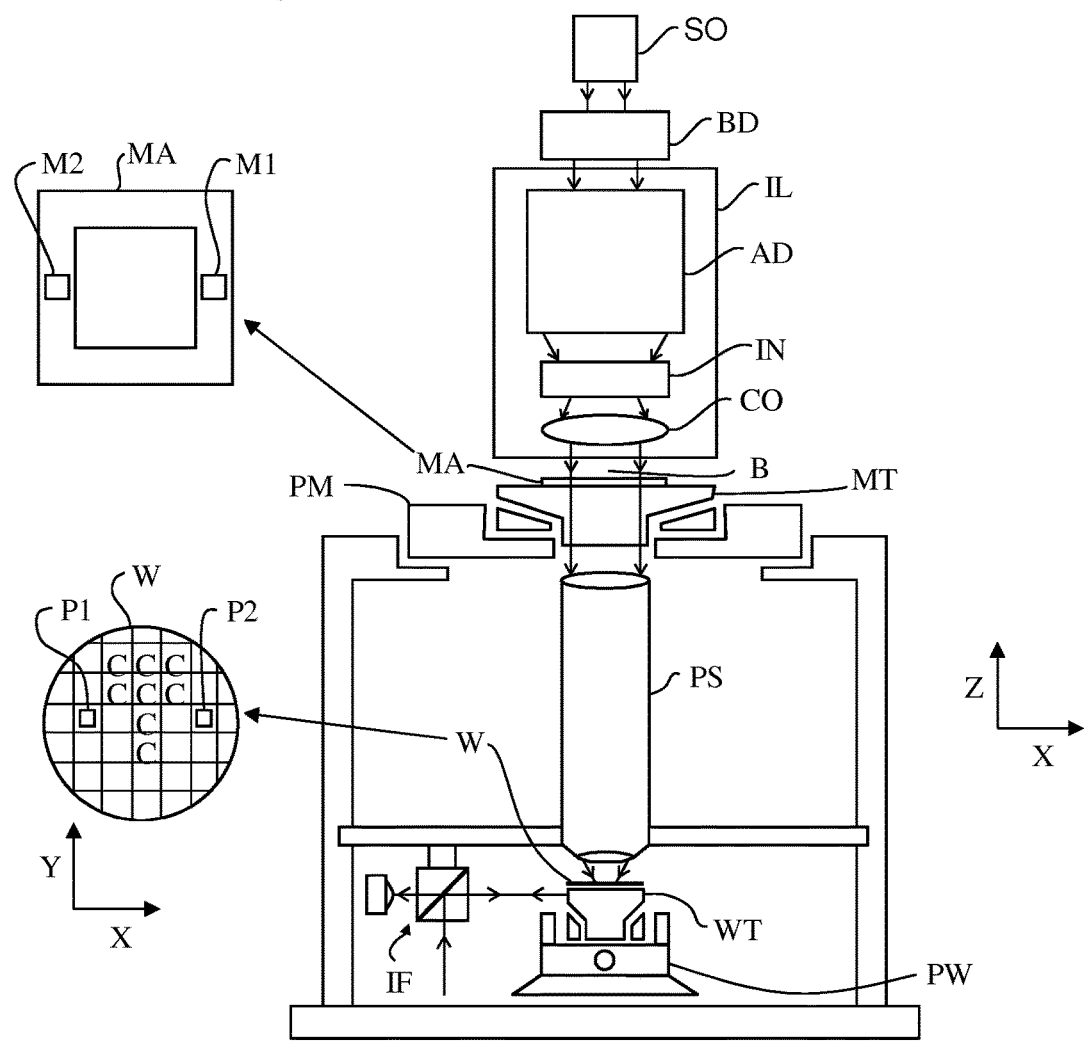
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The patterning device support structure MT structure supports, i.e. bears the weight of, the patterning device MA. The patterning device support structure MT holds the patterning device MA in a manner that depends on the orientation of the patterning device MA, the design of the lithographic apparatus, and other conditions, such as for example whether or not the patterning device MA is held in a vacuum environment. The patterning device support structure MT can use mechanical, vacuum, electrostatic or other clamping techniques to hold the patterning device. The patterning device support structure MT may be a frame or a table, for example, which may be fixed or movable as required. The patterning device support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion C of the substrate W. It should be noted that the pattern imparted to the radiation beam may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask). The terms "radiation beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The lithographic apparatus may be of a type having two (dual stage) or more substrate supports WT. The lithographic apparatus may have one or more patterning device support structures MT. In such "multiple stage" machines the additional supports may be used in parallel, or preparatory steps may be carried out on one or more supports while one or more other supports are being used for exposure. The lithographic apparatus may comprise a measurement table that is moveable relative to the projection system PS. The measurement table may have sensors to perform measurements, such as measuring an optical property of the radiation beam B projected by the projection system PS.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam B is passed from the radiation source SO to the illuminator IL with the aid of a beam delivery system BD including, for example, suitable directing mirrors and/or a beam expander. In other cases the source may be an integral part of the lithographic apparatus, for example when the source is a mercury lamp. The radiation source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device MA, which is held on the patterning device support structure MT, and is patterned by the patterning device MA. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device support structure MT may be realized with the aid of a long-stroke module and a short-stroke module, which form part of the first positioning device PM. The long-stroke module is arranged for coarse-positioning of the short-stroke module relative to the projection system PS. The short-stroke module is arranged for fine-positioning of the patterning device support structure MT relative to the long-stroke module. Similarly, movement of the substrate support WT may be realized using a long-stroke module and a short-stroke module, which form part of the second positioner PW. In the case of a stepper (as opposed to a scanner) the patterning device support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. These dedicated target portions are known as scribe-lane alignment marks. Similarly, in situations in which more than one die is provided on the patterning device MA, the mask alignment marks M1, M2 may be located between the dies.

Figure 2:
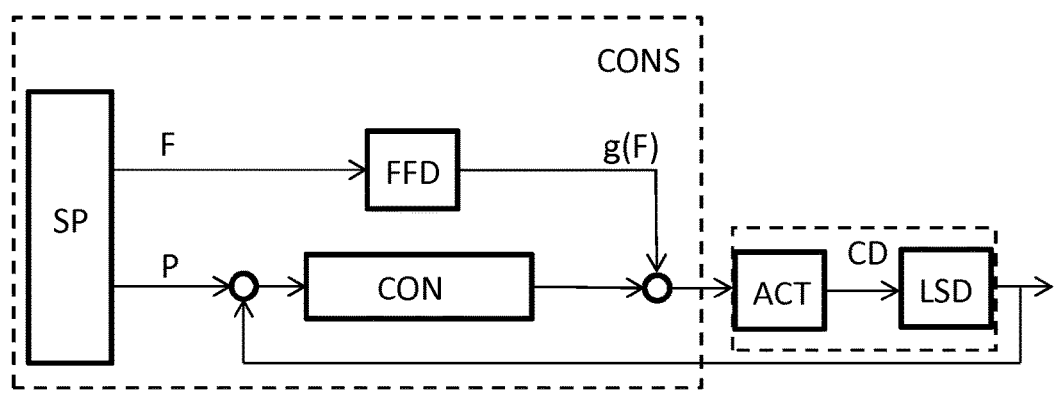
FIG. 2 depicts a positioning system according an embodiment of the invention.

FIG. 2 shows a closed loop positioning system comprising a control system CONS and a positioning device CD. The control system CONS is configured to control a position of the positioning device CD in six degrees of freedom. The positioning device CD is for example a substrate support W configured to position a substrate W during transfer of a pattern of the patterning device MA onto the substrate W. The positioning device CD may be the patterning device support MT or another support structure to be positioned in one or more degrees of freedom. The positioning device CD may comprise the first positioning device PM and/or the second positioning device PW.

The control system CONS comprises a set-point generator SP, a feedback controller CON, and a feedforward FFD.

The set-point generator SP is configured to provide a set-point signal P to the controller CON representative for a desired position of the positioning device CD. The set-point generator SP also provides a feedforward set-point signal $F_{sp}$ that is fed into the feedforward FFD. In the embodiment of FIG. 2, the set-point signal $F_{sp}$ represents a force F that is applied by the positioning device CD. The feedforward set-point signal $F_{sp}$ may be the same as the set-point signal P, but may also be another signal. Usually, the feed-forward set-point signal $F_{sp}$ will be a signal representative for the desired position of the positioning device CD, or a derivative thereof. For example, the feedforward set-point signal $F_{sp}$ may be the acceleration or snap, i.e., the time derivative of the acceleration, of the positioning device CD.

The feedback controller CON may for example be a PID controller, optimized for controlling a position of the positioning device CD.

The dynamic system to be controlled, in this case the positioning device CD, comprises two parts. A first part comprises an actuator ACT. A second part comprises linear stage dynamics LSD. The actuator ACT is a Lorentz actuator. In a Lorentz actuator the Lorentz force provided by the actuator is dependent on the input current. This can be described as:

$$F=k\,u,$$

wherein F is the force, u is the input current and k is a constant.

However, next to the Lorentz force a parasitic reluctance force may occur due to the generated magnetic field in combination with neighboring ferromagnetic material. This means that as a result of the input current u not only a Lorentz force, but also a reluctance force is exerted on the movable part of the substrate support WT. As a result, the constant k-factor is in that case not simply a constant but is dependent on the input current u. The force F resulting from an input current u may in that case be described as:

$$F=k(u)u=(k_0+k_1u)u=k_0u+k_1u^2=f(u).$$

wherein F is the force, u is the input current and k0 is a first constant and k1 is a second constant.

As a result of the parasitic reluctance force, there is a non-linear functional relationship between the input current u and the force F.

In prior art positioning systems of a substrate support WT of a lithographic apparatus finite impulse response (FIR) filters are used in the feedforward to increase performance of the control system CONS. In such feedforward having FIR filters, a non-linearity as described above is taken into account by optimizing the coefficients of the FIR filters, albeit in an implicit way since the time-independent non-linearity is translated into FIR coefficients. This may for example be done on the basis of a quadratic objective function related to a performance-relevant time-frame of the servo error signal using a Gauss-Newton method.

The fitting of the coefficients required to properly describe the non-linear characteristic in the linear relationships of the FIR filters may take substantial calibration time, since a substantially large number of coefficients is required to properly deal with the non-linear characteristic of the positioning device CD.

The present invention proposes to provide a control system CONS having a feedforward FFD in which the non-linear characteristic is explicitly taken into account by performing, in the feedforward FFD, a non-linear operation on the set point signal F, wherein the non-linear operation is based on a non-linear functional relationship of the non-linear characteristic.

To take the parasitic reluctance force of the Lorentz actuators into account, the functional relationship of the non-linear characteristic is used. In particular, the non-linear relationship between the output signal g(F) of the feedforward FFD and the resulting force F from the actuator ACT is determined, i.e. u=g(F).

$$F=f(u)=f(g(F)).$$

An analytic solution is possible using the abc formula:

$$u = \frac{-k_0 + \sqrt{k_0^2 + 4k_1 F}}{2k_1} = g(F).$$

In general however the function g(F) is unknown. But g(F) may be approximated using a Taylor series expansion around $F_0=0$, $$g(F) \approx g(F_0) + \frac{dg}{dF}\bigg|_{F=F_0} (F - F_0) + \frac{1}{2}\frac{d^2g}{dF^2}\bigg|_{F=F_0} (F - F_0)^2 + \dots$$

For the example above this would be $$g(F) \approx 0 + \frac{1}{\sqrt{k_0^2 + 4Fk_1}}\bigg|_{F=0} F - \frac{k_1}{(k_0^2 + 4k_1 F)^{1.5}}\bigg|_{F=0} F^2 + \dots$$

Taking parameters $k_0=1$ and $k_1=0.001$ (typically, Lorentz actuators are specified to have a k-factor which is accurate within 0.1 to 0.2 percent) this is $$g(F) \approx 0 + F - 0.001 F^2 +$$

In general, the function g(F) can be described as:

$$g(F) \approx a_0 + a_1 F + a_2 F^2 + \dots,$$

or $$g(F_{sp}) \approx \sum_{i=0}^{n} a_i F_{sp}^i$$

wherein g is the output signal, $F_{sp}$ is the set-point signal, a, are feedforward coefficients, and n is an integer larger than 1.

This function can be used to calculate a feed-forward signal that takes the non-linear characteristic of the dynamic system to be controlled into account.

Figure 3:
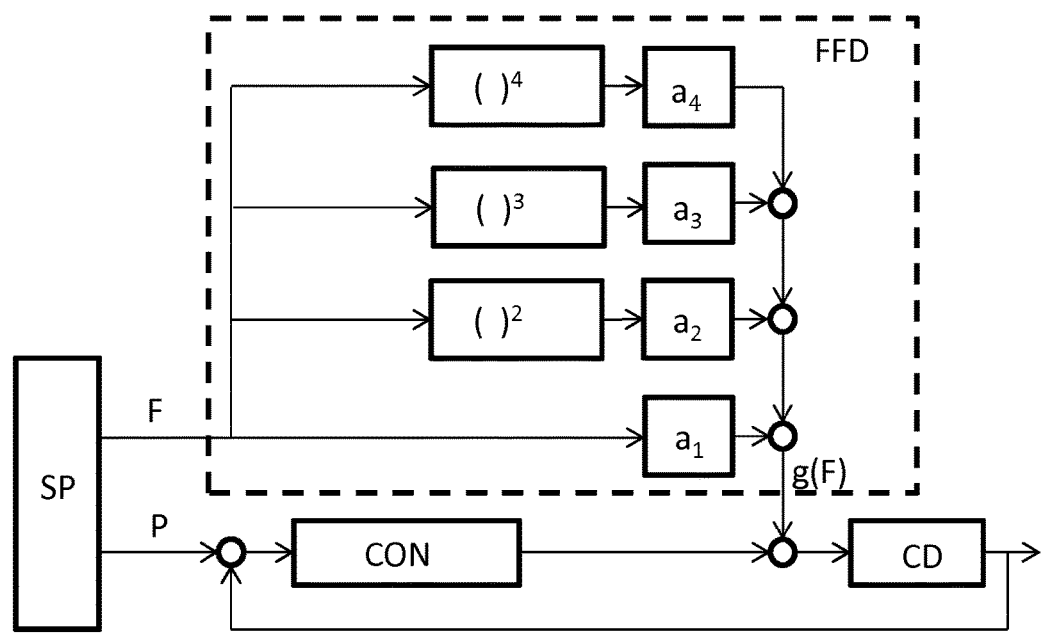
FIG. 3 depicts schematically a first embodiment of a control system for controlling a dynamic system having a non-linear characteristic.

FIG. 3 depicts a positioning system in which the feedforward FFD incorporating a non-linear operation is depicted in more detail. The other components of the positioning system, i.e. the set-point generator SP, the controller CON and the dynamics to be controlled are the same as FIG. 2. In the feedforward FFD of FIG. 3, the feed forward signal is constructed as follows.

$$g(F_{sp})=a_1 F_{sp} + a_2 F_{sp}^2 + a_3 F_{sp}^3 + a_4 F_{sp}^4$$

wherein g is the output signal, $F_{sp}$ is the set-point signal and $a_1$, $a_2$, $a_3$ and $a_4$ are feedforward coefficients.

The coefficients a1, a2, a3, and a4 of the feedforward FFD can be determined using the same method as used for fitting the coefficients of the FIR filters. An example of this method to fit the coefficients of FIR filters can be found in the publication "Data-Based Feed-Forward control in MIMO Motion Systems" by Mark Baggen, Marcel Heertjes and Ramidin Kamidi, 2008 American Control Conference, Seattle, Jun. 11-13 2008, the contents of which are herein incorporated in its entirety by reference.

In this method a data-based optimization approach is used, comprising three steps of selecting an objective function, selecting the optimization algorithm needed to minimize this objective function and the derivation of its gradients used in the process of optimization.

In the position control system as shown in FIGS. 2 and 3, a quadratic function of the measured tracking error is suitable as objective function.

The feedforward FFD is modeled on the non-linear functional relationship of the non-linear characteristics of the dynamic system CD to be controlled. The non-linear characteristic can be properly taken into account using a relatively low number of coefficients As a result, a small calibration time is required to optimize the feedforward coefficients.

Figure 4:
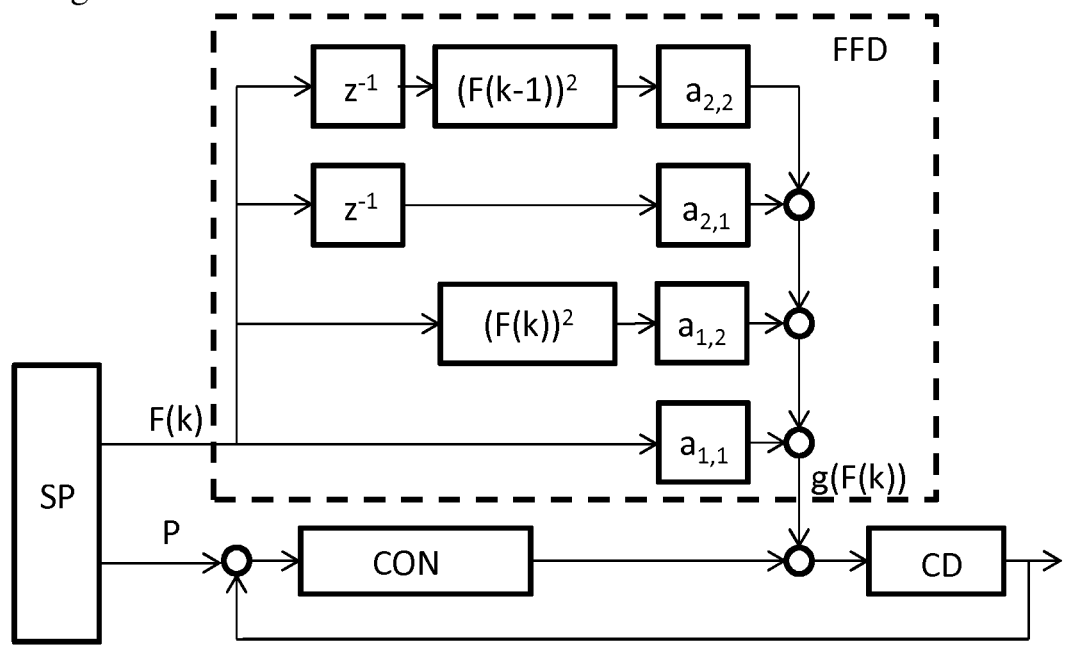
FIG. 4 depicts schematically a second embodiment of a control system for controlling a dynamic system having a non-linear characteristic.

FIG. 4 shows an alternative embodiment of a positioning system comprising a feedforward FFD using a non-linear operation in order to take into account non-linear characteristics of the dynamic system CD to be controlled.

The positioning system of FIG. 4 comprises a control system having a set-point generator SP, a feedback controller CON, for example a PID controller, and a feed forward FFD. The control system is configured to control, in six degrees of freedom, a position of a positioning device having a non-linear characteristic caused by the parasitic reluctance effect of Lorentz actuators used in the positioning device. The positioning device is represented in FIG. 4 as the dynamic system CD.

The main difference with the control system of FIG. 3 is that the control system of FIG. 3 comprises a feedforward FFD having a combination of time shifted FIR operations and non-linear operations. Within the FIR filter elements the time delayed versions of the set-point signal $F_{sp}$ are created using the time shift operator z, i.e., $F_{sp}(k-1)=z^{-1}F_{sp}(k)$.

In the combined feedforward FFD, the output signal g(F) at a current time, represented by sample k, is based on a non-linear operation on the set-point signal $F_{sp}(k)$ at the current sample k and a time shifted operation $z^{-1}$ on the set-point signal using a time shifted sample (k−1) from another time than the current time and/or combinations thereof.

The combination of non-linear operations and time shifted operations can generally be described as:

$$g(F_{sp}(k)) = \sum_{i=1, j=1}^{n,m} a_{i,j}(F_{sp}(k+1-i))^j,$$

wherein g is the output signal, $F_{sp}$ is the set-point signal, $a_{i,j}$ are feedforward coefficients, k is a sample number, n is an integer and m is an integer larger than 1.

The specific output signal of the feedforward FFD shown in FIG. 4 can be described as)

$$g(F_{sp}(k)) = a_{1,1}F_{sp}(k) + a_{1,2}(F_{sp}(k))^2 + a_{2,1}F_{sp}(k-1) + a_{2,2}(F_{sp}(k-1))^2$$

wherein g is the output signal, $F_{sp}$ is the set-point signal, $a_{1,1}$, $a_{1,2}$, $a_{2,1}$ and $a_{2,2}$ are feedforward coefficients, and k is a sample number.

In this feedforward FFD, the output signal $g(F_{sp}(k))$ depends on non-linear operations and time shifted operations relating to the set-point signal of the previous sample k−1, wherein $F_{sp}(k-1) = z^{-1}F_{sp}(k)$.

In further embodiments, further time shifted operations can be applied in which set-point signals of other previous samples k+1−i can be taken into account. Preferably, only previous samples k+1−i, wherein i>0 are taken into account rather than samples that are later than current sample k. A causal system is maintained when only previous samples k+1−i with i>0 are used.

The feedforward coefficients may again be optimized by a machine in the loop procedure using a Gauss-Newton method, as described above.

The advantage of combining the non-linear operations and time-shifted operations is that the different characteristics of the dynamic system CD to be controlled, in particular both non-linear characteristics and time shifted characteristics can be taken into account explicitly.

The position control systems described hereinabove, are configured to control the positioning device in six degrees of freedom. In the control schemes of FIGS. 2, 3 and 4 the feedforward FFD of only one degree of freedom/variable has been shown. It will be clear that similar feedforward signal constructions can be used to determine a feedforward output signal for other degrees of freedom/variables. Instead of 6 degrees of freedom, any other number of degrees of freedom may be used. For example, the position control system may be used to control 1, 2, 3 or more than 6 degrees of freedom.

Hereinabove, the use of non-linear operations in the feedforward FFD have been described in order to take into account non-linear characteristics of a positioning device, in particular a substrate support WT of a lithographic apparatus comprising a Lorentz actuator having a parasitic reluctance force effect. However, the non-linear operation in the feedforward FFD may also be used in the feedforward of any other control system in which the dynamic system CD to be controlled comprises a non-linear characteristic, wherein the non-linear operation is based on a non-linear functional relationship of the non-linear characteristic of the dynamic system CD.

The control system may for example be configured to control a temperature of a dynamic system having a non-linear characteristic.

The control system may be arranged to control any parameter of a dynamic system. In the embodiments described above, the parameter is the force F. The parameter may be a mechanic parameter, such as a position, a velocity, an acceleration or a force. Such a parameter may be a thermal parameter such as a temperature, a heat flux or a thermal expansion. Such a parameter may be an electrical parameter such as an electrical current, a voltage or an impedance.

The feedforward may be arranged to perform the non-linear operation to a set-point signal representing a desired value of the parameter. The non-linear operation is based on a non-linear functional relationship between the output signal as provided by the feedforward and the parameter.

In an embodiment, there is provided a control system configured to control a parameter of a dynamic system, wherein the parameter depends on an output signal, the control system comprising a set-point generator and a feedforward, wherein the set-point generator is arranged to provide a set-point signal to the feedforward, wherein the feedforward is arranged to provide the output signal based on the set-point signal, wherein the feedforward is arranged to perform a non-linear operation on the set-point signal, and wherein the non-linear operation is based on a non-linear functional relationship between the output signal and the parameter.

In an embodiment, the dynamic system comprises a motion system. In an embodiment, the non-linear operation is based on an approximation of the non-linear functional relationship using a Taylor series expansion. In an embodiment, the feedforward is arranged to provide the output signal using: $g(F) = \sum_{i=0}^{n} a_i F^i$ wherein g is the output signal, F is the set-point signal, $a_i$ are feedforward coefficients and n is an integer larger than 1. In an embodiment, the feedforward coefficients are optimized using a Gauss-Newton method. In an embodiment, the feedforward comprises a finite impulse response (FIR) filter. In an embodiment, the output signal is based on i) a non-linear operation on a value of the set-point signal at a first time sample, and ii) a further value of the set-point signal at a second time sample, wherein the first time sample and the second time sample are different from each other. In an embodiment, the feedforward is arranged to perform the non-linear operation and a time shifted operation of the finite impulse response (FIR) filter in a combined feedforward. In an embodiment, the feedforward is arranged to provide the output signal using: $g(F(k)) = \sum_{i=1,j=1}^{n,m} a_{i,j}(F(k+1-i))^j$, wherein g is the output signal, F is the set-point signal, $a_{i,j}$ are feedforward coefficients, k is a sample number, n is an integer and m is an integer larger than 1. In an embodiment, the feedforward coefficients are optimized using a Gauss-Newton method.

In an embodiment, there is provided a positioning system arranged to position an object in a desired position, the positioning system comprising: a positioning device configured to position the object, and a control system as described herein, wherein the dynamic system comprises the positioning device. In an embodiment, the positioning device comprises an actuator configured to apply a force to the object, and wherein the non-linear functional relationship comprises a non-linear dependency of the force resulting from an electrical current through the actuator. In an embodiment, the non-linear functional relationship results from a parasitic reluctance force in a Lorentz type actuator.

In an embodiment, there is provided a lithographic apparatus configured to project a pattern onto a substrate, comprising the positioning system as described herein.

In an embodiment, there is provided a device manufacturing method comprising transferring a pattern from a patterning device onto a target portion of a substrate, the method comprising: providing a set-point signal representative of a desired value of a parameter of the patterning device or the substrate; creating an output signal by performing a non-linear operation on the set-point signal, wherein the non-linear operation is based on a non-linear functional relationship between the output signal and the parameter; and controlling the parameter based on the output signal.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the term "wafer" herein may be considered as synonymous with the more general terms "substrate", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A control system configured to control a parameter of a dynamic system, wherein the parameter depends on an output signal, the control system comprising a set-point generator and a feedforward,
    wherein the set-point generator is arranged to provide a set-point signal to the feedforward, the set-point signal being representative of a desired value of the parameter,
    wherein the feedforward is arranged to provide the output signal based on the set-point signal,
    wherein the feedforward is arranged to perform a non-linear operation on the set-point signal, and
    wherein the non-linear operation is based on a non-linear functional relationship between the output signal and the parameter.

2. The control system of claim 1, wherein the dynamic system comprises a motion system.

3. The control system of claim 1, wherein the non-linear operation is based on an approximation of the non-linear functional relationship using a Taylor series expansion.

4. The control system of claim 1, wherein the feedforward is arranged to provide the output signal using:

$$g(F) = \sum_{i=0}^{n} a_i F^i$$

wherein g is the output signal, F is the set-point signal, $a_i$ are feedforward coefficients and n is an integer larger than 1.

5. The control system of claim 4, wherein the feedforward coefficients are optimized using a Gauss-Newton method.

6. The control system of claim 1, wherein the feedforward comprises a finite impulse response (FIR) filter.

7. The control system of claim 1, wherein the output signal is based on i) a non-linear operation on a value of the set-point signal at a first time sample, and ii) a further value of the set-point signal at a second time sample, wherein the first time sample and the second time sample are different from each other.

8. The control system of claim 6, wherein the feedforward is arranged to perform the non-linear operation and a time shifted operation of the finite impulse response (FIR) filter in a combined feedforward.

9. The control system of claim 6, wherein the feedforward is arranged to provide the output signal using:

$$g(F(k)) = \sum_{i=1, j=1}^{n,m} a_{i,j} (F(k+1-i))^j,$$

wherein g is the output signal, F is the set-point signal, $a_{i,j}$ are feedforward coefficients, k is a sample number, n is an integer and m is an integer larger than 1.

10. The control system of claim 9, wherein the feedforward coefficients are optimized using a Gauss-Newton method.

11. A positioning system arranged to position an object in a desired position, the positioning system comprising:
    a positioning device configured to position the object, and
    a control system as claimed in claim 1,
    wherein the dynamic system comprises the positioning device.

12. The positioning system of claim 11, wherein the positioning device comprises an actuator configured to apply a force to the object, and
    wherein the non-linear functional relationship comprises a non-linear dependency of the force resulting from an electrical current through the actuator.

13. The positioning system of claim 12, wherein the non-linear functional relationship results from a parasitic reluctance force in a Lorentz type actuator.

14. A lithographic apparatus configured to project a pattern onto a substrate, comprising the positioning system as claimed in claim 11.

15. A device manufacturing method comprising transferring a pattern from a patterning device onto a target portion of a substrate, the method comprising:
    providing a set-point signal representative of a desired value of a parameter of the patterning device or the substrate;

creating an output signal by performing a non-linear operation on the set-point signal, wherein the non-linear operation is based on a non-linear functional relationship between the output signal and the parameter; and controlling the parameter based on the output signal.

16. A non-transitory computer-readable medium comprising instructions configured to cause a computer system to at least:

provide a set-point signal representative of a desired value of a parameter of dynamic system;

create an output signal by performing a non-linear operation on the set-point signal, wherein the non-linear operation is based on a non-linear functional relationship between the output signal and the parameter; and control the parameter based on the output signal.

17. The computer-readable medium of claim 16, wherein the dynamic system comprises a motion system.

18. The computer-readable medium of claim 16, wherein the non-linear operation is based on an approximation of the non-linear functional relationship using a Taylor series expansion.

19. The computer-readable medium of claim 16, wherein the instructions configured cause the computer system to create the output signal are further configured to cause the computer system to provide the output signal using:

$$g(F) = \sum_{i=0}^{n} a_i F^i$$

wherein g is the output signal, F is the set-point signal, $a_i$ are feedforward coefficients and n is an integer larger than 1.

20. The computer-readable medium of claim 16, wherein the output signal is based on i) a non-linear operation on a value of the set-point signal at a first time sample, and ii) a further value of the set-point signal at a second time sample, wherein the first time sample and the second time sample are different from each other.

* * * * *